(12) United States Patent
Jain et al.

(10) Patent No.: US 12,538,579 B2
(45) Date of Patent: *Jan. 27, 2026

(54) SEMICONDUCTOR STRUCTURE INCLUDING SECTIONED WELL REGION

(71) Applicant: GlobalFoundries U.S. Inc., Malta, NY (US)

(72) Inventors: Navneet Jain, Milpitas, CA (US); Nigel Chan, Dresden (DE); Mahbub Rashed, Cupertino, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/653,473

(22) Filed: May 2, 2024

(65) Prior Publication Data

US 2024/0282776 A1    Aug. 22, 2024

Related U.S. Application Data

(63) Continuation of application No. 17/533,402, filed on Nov. 23, 2021, now Pat. No. 12,046,603.

(51) Int. Cl.
   *H10D 87/00*   (2025.01)

(52) U.S. Cl.
   CPC .................. *H10D 87/00* (2025.01)

(58) Field of Classification Search
   CPC ........... H10D 30/6734; H10D 30/6744; H10D 84/0191; H10D 84/038; H10D 84/859; H10D 86/201; H10D 87/00
   See application file for complete search history.

(56) References Cited

U.S. PATENT DOCUMENTS

| | | |
|---|---|---|
| 6,560,753 B2 | 5/2003 | Barney et al. |
| 7,098,512 B1 * | 8/2006 | Pelham ............... H10D 89/215 |
| | | 257/296 |
| 8,099,556 B2 | 1/2012 | Ghosh et al. |
| (Continued) | | |

OTHER PUBLICATIONS

U.S. Appl. No. 18/470,314, Office Action dated Jan. 23, 2025, 9 pages.

(Continued)

*Primary Examiner* — Shaun M Campbell
(74) *Attorney, Agent, or Firm* — David Cain; Hoffman Warnick LLC

(57) ABSTRACT

Disclosed is a semiconductor structure including a substrate with a first type conductivity (e.g., a P-silicon substrate); a deep well region within the substrate and having a second type conductivity (e.g., a deep Nwell); alternating stripes of first and second well regions (e.g., of Pwells and Nwells with each Pwell positioned laterally between and abutting two Nwells) within the substrate above and traversing the deep well region; and an isolation region (e.g., an Nwell-type isolation region) dividing a first well region (e.g., a Pwell) into sections. Since the sectioned first well region has the first type conductivity and since the isolation region, the deep well region below, and the adjacent well regions on either side have the second type conductivity, the different sections of the sectioned well region are electrically isolated and devices formed on an insulator layer above the different sections can be subjected to different back-biasing conditions.

20 Claims, 6 Drawing Sheets

(56) References Cited

U.S. PATENT DOCUMENTS

| | | | |
|---|---|---|---|
| 8,552,500 | B2 | 10/2013 | Dennard et al. |
| 9,697,874 | B1 | 7/2017 | Asnaashari et al. |
| 9,754,966 | B1* | 9/2017 | Yuan .................. H10D 62/106 |
| 10,068,918 | B2 | 9/2018 | Haufe et al. |
| 10,360,334 | B2 | 7/2019 | Jain et al. |
| 10,909,298 | B1 | 2/2021 | Chan et al. |
| 11,587,601 | B1 | 2/2023 | Paul et al. |
| 12,046,603 | B2* | 7/2024 | Jain .................... H10D 84/0191 |
| 2002/0057610 | A1 | 5/2002 | Baliga |
| 2005/0051801 | A1 | 3/2005 | Shaw et al. |
| 2011/0049631 | A1* | 3/2011 | Itaka ..................... H10D 84/85 |
| | | | 257/351 |
| 2014/0183602 | A1 | 7/2014 | Gurumurthy |
| 2014/0306319 | A1* | 10/2014 | Torii .................. H10D 84/0188 |
| | | | 257/547 |
| 2017/0194319 | A1 | 7/2017 | Xu et al. |
| 2017/0330899 | A1 | 11/2017 | Yuan et al. |
| 2018/0138203 | A1* | 5/2018 | Zang .................... H10D 62/378 |
| 2018/0225406 | A1 | 8/2018 | Jain et al. |

OTHER PUBLICATIONS

Anonymous et al., "Advanced Caching Techniques," CSE P548-Advanced Caching Techniques, Autumn 2006, 11 pages.

Anonymous et al., "The Logic of the Cache access in Detail," retrieved from https://sabercomlogica.com/en/the-logic-of-the-cache-access-in-detail/ on Aug. 31, 2023, 7 pages.

Desikan et al., "On-chip MRAM as a High-Bandwidth, Low-Latency Replacement for DRAM Physical Memories," Submitted to the 35th International Symposium on Microarchitecture, Computer Science Department, University of Texas at Austin, Sep. 27, 2002, 13 pages.

Do et al., "Agressive Leakage Current Reduction for Embedded MRAM Using Block-Level Power Gating," IECON, IEEE Oct. 2020 The 46th Annual Conference of the IEEE Industrial Electronics Society, pp. 2249-2254.

U.S. Appl. No. 17/533,402, filed Nov. 23, 2021, 26 pages.

U.S. Appl. No. 17/533,402, Response to Office Action filed Mar. 19, 2024, 15 pages.

U.S. Appl. No. 17/533,402, Office Action dated Jan. 30, 2024, 26 pages.

Jain et al., "Low Cost and Highly Manufacturable MOL/BEOL Constructs in 22FDSOI Technology for High Performance and Low Power Applications," 2018, IEEE Electron Devices Technology and Manufacturing Conference Proceedings of Technical Papers, downloaded on Jan. 12, 2022 from IEEE Xplore, pp. 91-93.

Jones et al., "The Memory Subsystem," Part of CS:2630, Computer Organization Notes, The University of Iowa Department of Computer Science, retrieved from: https://homepage.cs.uiowa.edu/~dwjones/assem/notes/14memory.shtml on May 31, 2023, 16 pages.

Marinelli et al., "Microarchitectural Exploration of STT-MRAM Last-level Cache Parameters for Energy-efficient Devices," ACM Transactions on Embedded Computing Systems, vol. 21, No. 1, Article 3, Published Jan. 2022, 20 pages.

U.S. Appl. No. 18/470,314, Notice of Allowance dated Mar. 18, 2025, 7 pages.

U.S. Appl. No. 18/470,314, Application as Filed on Sep. 19, 2023, 48 pages.

\* cited by examiner

SEMICONDUCTOR STRUCTURE INCLUDING SECTIONED WELL REGION

BACKGROUND

Field of the Invention

The present invention relates to semiconductor structures and, more particularly, to embodiments of a semiconductor structure with in-substrate well regions.

Description of Related Art

Key factors considered in modern integrated circuit design include, but are not limited to, performance improvement, size scaling, and power consumption. Oftentimes design changes with respect to one of these factors can result in an undesirable trade-off with respect to one or more of the other factors. For example, advantages associated with manufacturing complementary metal oxide semiconductor (CMOS) designs using advanced semiconductor-on-insulator processing technology platforms (e.g., a fully-depleted silicon-on-insulator (FDSOI) processing technology platform) include back gate biasing to improve performance (e.g., forward back-biasing (FBB) or reverse back-biasing (RBB) for fine tuning the threshold voltage (Vt) of on-chip field effect transistors (FETs)). While back gate biasing to improve performance is an option, typically back gate well regions with a given type conductivity are biased at the same voltage level. For example, back gate Pwells are biased to the same first voltage level and all back gate Nwells are biased to the same second voltage level. However, in some cases FETs with the same type conductivity could benefit from different back gate bias voltage conditions. Unfortunately, currently available solutions that enable different back gate bias voltage conditions for FETs of the same type conductivity can result in a significantly large increase in area consumption.

SUMMARY

In view of the foregoing disclosed herein are embodiments of a semiconductor structure including at least one sectioned well region where the different sections thereof are electrically isolated and, thus, biasable at different voltage levels. This configuration is achievable without a significant increase in area consumption.

Generally, the semiconductor structure can include a semiconductor substrate with a first type conductivity. The semiconductor structure can further include a deep well region within the semiconductor substrate. The deep well region can have a second type conductivity that is different from the first type conductivity. The semiconductor structure can further include alternating first and second well regions within the semiconductor substrate above, adjacent to, and traversing (i.e., extending across) the deep well region. The alternating first and second well regions can be arranged, for example, as elongated parallel stripes. Each first well region can have the same first type conductivity as the substrate and each second well region can have the same second type conductivity as the deep well region. Each first well region can be positioned laterally between and abut two second well regions. The semiconductor structure can further include an isolation region, which is within the semiconductor substrate and which divides (i.e., sections) a first well region of the alternating first and second well regions into different sections. Due to the isolation region, the different sections of the sectioned first well region are electrically isolated and, thus, biasable at different voltage levels.

Some embodiments of the semiconductor structure can specifically include a P-silicon substrate and a deep Nwell within the P-silicon substrate. In these embodiments, the semiconductor structure can further include alternating Pwells and Nwells within the P-silicon substrate above, adjacent to, and traversing (i.e., extending across) the deep Nwell. The alternating Pwells and Nwells can be arranged, for example, as elongated parallel stripes with each Pwell positioned laterally between and abutting two Nwells. In these embodiments, the semiconductor structure can further include an Nwell-type isolation region, which is within the P-silicon substrate and which divides (i.e., sections) a Pwell of the alternating Pwells and Nwells into different sections. In this case, due to the Nwell-type isolation region, the different sections of the sectioned Pwell are electrically isolated and, thus, biasable at different voltage levels.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
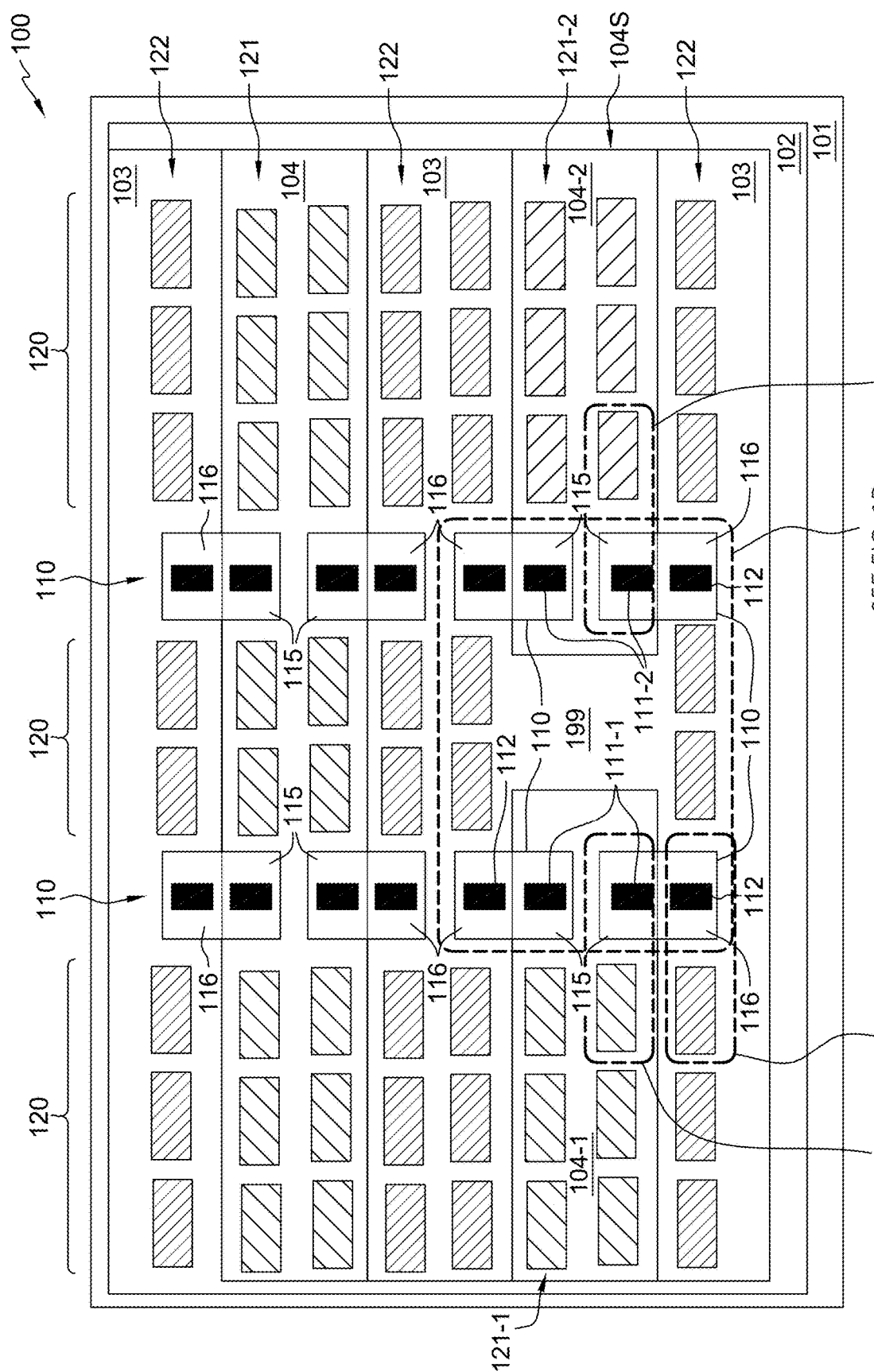
FIG. 1A is a layout diagram illustrating an embodiment of a semiconductor structure.

As mentioned above, key factors considered in modern integrated circuit design include, but are not limited to, performance improvement, size scaling, and power consumption. Oftentimes design changes with respect to one of these factors can result in an undesirable trade-off with respect to one or more of the other factors. For example, advantages associated with manufacturing complementary metal oxide semiconductor (CMOS) designs using advanced semiconductor-on-insulator processing technology platforms (e.g., a fully-depleted silicon-on-insulator (FDSOI) processing technology platform) include back gate biasing to improve performance (e.g., forward back-biasing (FBB) or reverse back-biasing (RBB) for fine tuning the threshold voltage (Vt) of on-chip field effect transistors (FETs)). While back gate biasing to improve performance is an option, back gate well regions with the same type conductivity are typically biased at the same voltage level. That is, back gate Pwells are typically biased to the same first voltage level and back gate Nwells are typically biased to the same second voltage level. Sometimes, however, it may be advantageous to bias two or more back gate well regions that have the same type conductivity (e.g., two or more back gate Pwells) to different voltage levels. Unfortunately, currently available solutions for biasing two or more back gate well regions that have the same type conductivity (e.g., two or more back gate Pwells) to different voltage levels can result in a significantly large increase in area consumption. More specifically, a P-substrate will typically include a deep Nwell and alternating Pwells and Nwells arranged in stripes across the deep Nwell. The Pwells will be biased at the same first voltage level and the Nwells will be biased at the same second voltage level. If, however, a designer wants to bias different Pwells at different voltage levels, multiple deep Nwells are formed in the substrate such that they are electrically isolated from each other. In this case, Pwells on the different deep Nwell can be biased at different first voltage levels. Unfortunately, adding multiple electrically isolated deep Nwells into the design of the semiconductor structure will significantly increase the footprint.

In view of the foregoing disclosed herein are embodiments of a semiconductor structure including at least one sectioned well region where the different sections thereof are electrically isolated and, thus, biasable at different voltage levels. This configuration is achievable without a significant increase in area consumption. Specifically, in the disclosed embodiments, the semiconductor structure can include: a semiconductor substrate with a first type conductivity (e.g., a P-silicon substrate); a deep well region within the substrate and having a second type conductivity (e.g., a deep Nwell); and alternating stripes of first and second well regions (e.g., of Pwells and Nwells) within the substrate above, immediately adjacent to, and traversing (i.e., extending across) the deep well region. The semiconductor structure can further include an isolation region (e.g., an Nwell-type isolation region) within the substrate and dividing (i.e., sectioning) a first well region (e.g., a Pwell) into different sections. Since the sectioned first well region has the first type conductivity and since the isolation region, the deep well region below, and the adjacent well regions on either side all have the second type conductivity, the different sections of the sectioned well region are electrically isolated and, thus, biasable at different voltage levels. In advanced semiconductor-on-insulator processing technology platforms (e.g., a fully-depleted silicon-on-insulator (FDSOI) processing technology platform) such a configuration allows different groups of field effect transistors (FETs), which are formed in semiconductor-on-insulator regions over different sections of a sectioned well region, to be subjected to different back-biasing conditions in order to tailor performance.

More particularly, disclosed herein are embodiments of a semiconductor structure 100 (see FIGS. 1A-1D). Referring to FIGS. 1A-1D in combination, the semiconductor structure 100 can include a semiconductor substrate 101 with a first type conductivity. For example, in some embodiments, the semiconductor substrate 101 can be a silicon substrate with P-type conductivity at a relatively low conductivity level (i.e., a P-silicon substrate).

The semiconductor structure 100 can further include a deep well region 102 (also referred to as a buried well region or buried dopant implant region) within the semiconductor substrate 101 both above the bottom surface of the semiconductor substrate 101 and below the top surface of the semiconductor substrate 101. The deep well region can have a second type conductivity that is different from the first type conductivity. For example, in some embodiments, the deep well region can be a deep Nwell. In any case, this deep well region can have a relatively large area.

The semiconductor structure 100 can further include alternating first well regions 104 and second well regions 103 within the semiconductor substrate 101 above, immediately adjacent to, and traversing (i.e., extending across) the deep well region 102. The alternating first well regions 104 and second well regions 103 can be dopant implant regions, which are arranged, for example, as elongated parallel stripes with each first well region 104 having the first type conductivity and being positioned laterally between and abutting a pair of second well regions 103 having the second type conductivity. Each first well region can specifically have the same first type conductivity as the substrate 101, but at a higher conductivity level. Each second well region 103 can specifically have the same second type conductivity as the deep well region 102, at approximately the same conductivity level. Thus, for example, in some embodiments, the first well regions 104 can be Pwells and the second well regions 103 can be Nwells. In any case, each of these well regions 103-104 can be a dopant implant region that, for example, extends from the top of the deep well region 102 to the top surface of the semiconductor substrate 101.

Figure 1B:
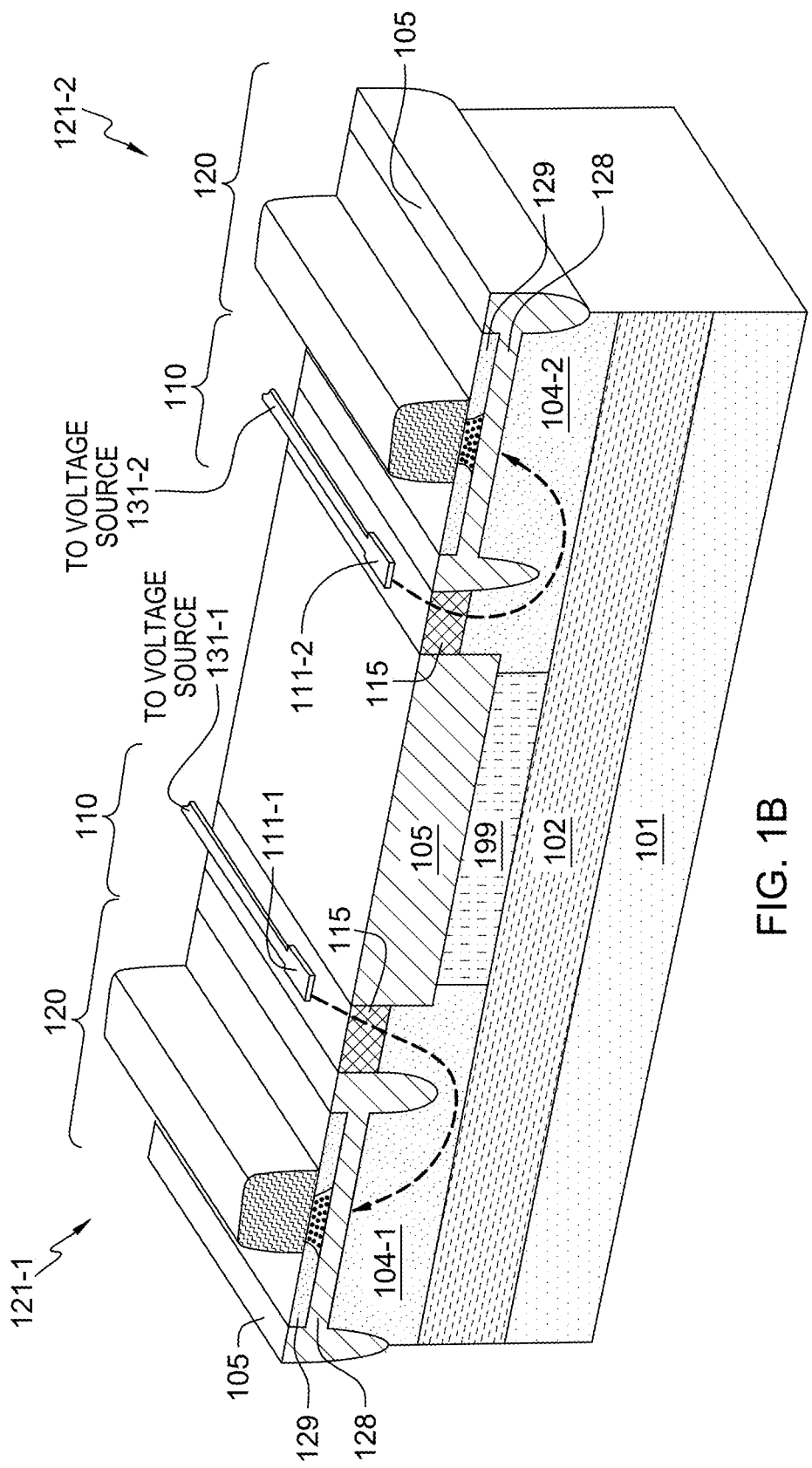
FIG. 1B is an enlarged isometric view drawing illustrating two devices (e.g., two field effect transistors (FETs)) on different separately biasable sections, respectively, of a divided well region separated by an isolation region in the semiconductor structure of FIG. 1A.
Figure 1C:
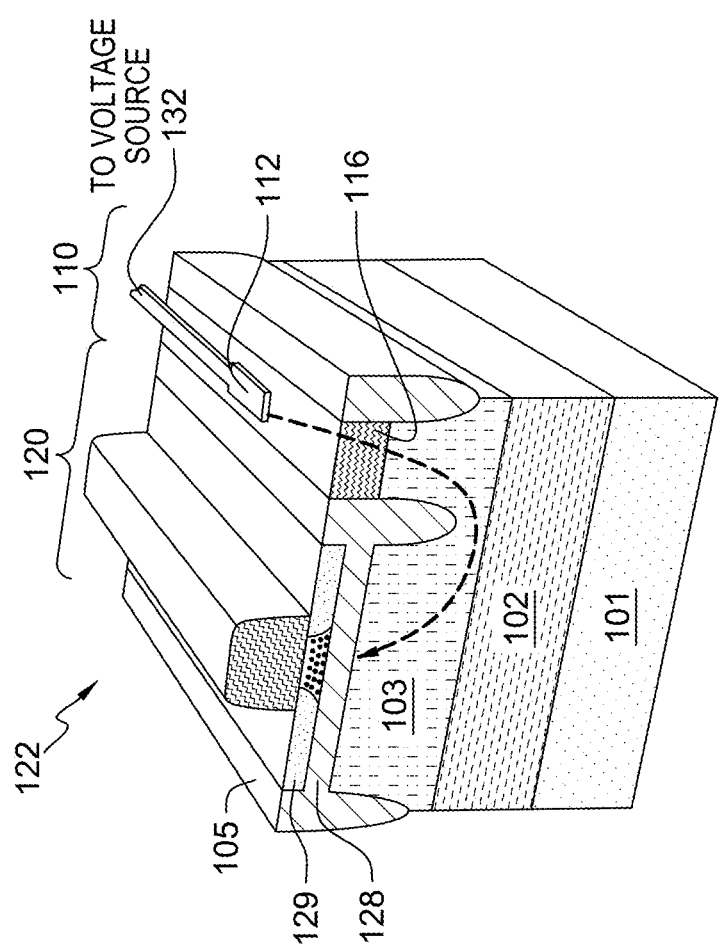
FIG. 1C is an enlarged isometric view drawing illustrating another device (e.g., another FET) on another well region in the semiconductor structure of FIG. 1A.
Figure 1D:
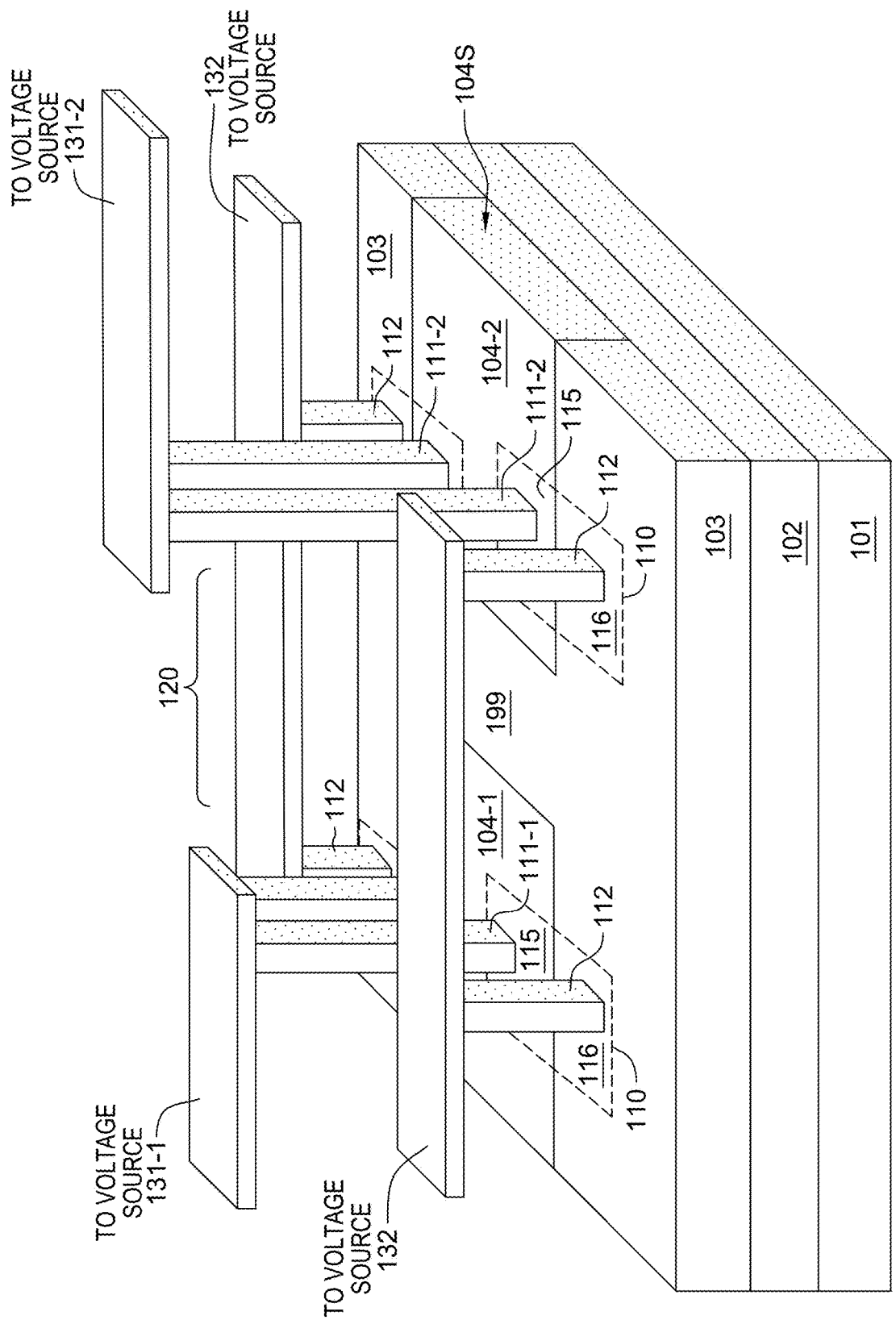
FIG. 1D is a perspective view drawing illustrating a portion of the semiconductor structure including the isolation region between separately biasable sections of a divided well region in the semiconductor structure of FIG. 1A.

The semiconductor structure 100 can further include an isolation region 199, which is within the semiconductor substrate 101 and which divides (i.e., sections) a first well region 104 of the alternating first and second well regions into different sections 104-1 and 104-2, thereby forming a sectioned first well region 104S (see FIGS. 1A, 1B and 1D showing the isolation region 199 between sections 104-1 and 1-4-2). This isolation region 199 can be immediately adjacent to the top of the deep well region 102 and can extend vertically from the top of the deep well region 102 to the top surface of the semiconductor substrate 101. This isolation region 199 can further extend laterally completely through a first well region 104 from one side to an opposite side (i.e., from one second well region to another second well region on opposite sides of the first well region). Thus, the isolation region 199 is essentially perpendicularly oriented relative to the stripes of alternating first and second well regions. The isolation region 199 can be, for example, a doped well-type isolation region (i.e., another dopant implant region), which has the same second type conductivity as the deep well region 102 and the second well regions 103. Thus, for example, in some embodiments, the isolation region 199 can be an Nwell-type isolation region that divides (i.e., sections) a Pwell 104 into different Pwell sections 104-1 and 104-2.

Since the sectioned first well region 104S and, particularly, since the different sections 104-1 and 104-2 thereof have the first type conductivity and since the isolation region 199, the deep well region 102 below, and the adjacent second well regions 103 on either side all have the second type conductivity, the different sections 104-1 and 104-2 of the sectioned first well region 104S are electrically isolated and, thus, biasable at different voltage levels. That is, if the sectioned first well region 104S is a sectioned Pwell and if the isolation region 199 is an Nwell-type isolation, the deep well region 102 below is a deep Nwell, and the adjacent second well regions 103 are Nwells, then the different Pwell sections 104-1 and 104-2 will be effectively electrically isolated from each other and, thus, biasable at different voltage levels. Biasing the different sections 104-1 and 104-2 at different voltage levels can be employed to tailor performance of devices formed thereon.

For example, optionally, the semiconductor structure 100 can be formed using an advanced semiconductor-on-insulator processing technology platforms (e.g., a fully-depleted silicon-on-insulator (FDSOI) processing technology platform). In this case, the semiconductor structure 100 can include both bulk regions 110 (also referred to as hybrid regions) and semiconductor-on-insulator regions 120 (e.g., silicon-on-insulator (SOI) regions) above the alternating first well regions 104 and second well regions 103.

Each bulk region 110 can be above, can be immediately adjacent to, and can traverse a small section of the interface between adjacent first and second well regions. Each bulk region 110 can be designed as a tap cell. That is, each bulk region 110 can include a first contact area 115, which is above and immediately adjacent to the first well region 104 on one side of the interface between the well regions, and a second contact area 116, which is above and immediately adjacent to the second well region 103 on the opposite side of the interface between the well regions. The first contact area 115 can include, for example, a first epitaxial semiconductor layer (e.g., a first epitaxial silicon layer) with the same first type conductivity as the first well region 104 below at a higher conductivity level. The second contact area 116 can include, for example, a second epitaxial semiconductor layer (e.g., a second epitaxial silicon layer) with the same second type conductivity as the second well region 103 below at a higher conductivity level. Thus, in some embodiments, the first contact area 115 within the bulk region 110 can be a P+ epitaxial silicon layer on a Pwell and the second contact area 116 within the same bulk region can be an N+ epitaxial silicon layer on an Nwell. Adjacent first and second well regions can have multiple bulk regions 110 thereon. Furthermore, at least one bulk region 110 can overlay each of the sections 104-1 and 104-2 of the sectioned first well region 104S and a second well region 103 adjacent to the section. The bulk regions 110 and, particularly, the contact areas 115, 116 therein can facilitate contacting the first well regions 104, including the different sections 104-1 and 104-2 of the sectioned first well region 104S, and the second well regions 103, as discussed in greater detail below.

Within the semiconductor-on-insulator regions 120, the semiconductor structure 100 can include thin insulator layers 128 (e.g., a thin silicon dioxide layer or other suitable insulator layer) on the alternating first well regions 104 and second well regions 103 and thin semiconductor layers 129 (e.g., thin silicon layers) on the thin insulator layers 128. Within the semiconductor-on-insulator regions 120, the semiconductor structure 100 can also include field effect transistors (FETs). Each FET can include a channel region in a semiconductor layer 129 above an insulator layer 128 on one of the well regions. Each FET can further include source/drain regions on the insulator layer 128 on opposing sides of the channel region and a gate structure above the channel region. Such FET structures are well known in the art and, thus, the additional details thereof have been omitted from this specification in order to allow the reader to focus on the salient aspects of the disclosed embodiments. In any case, the FETs can include first FETs 121 above the first well regions 104 and second FETs 122 above second well regions 104.

The semiconductor structure 100 can also include various shallow trench isolation (STI) regions 105 that extend into the well regions 103, 104 (e.g., the deep well regions 102). These STI regions 105 can be employed, for example, to electrically isolate the semiconductor-on-insulator regions 120 from the bulk regions 110, to electrically isolate different semiconductor-on-insulator regions 120 from each other, to electrically isolate the first contact areas 115 from the second contact areas 116 within each bulk region 110.

It should be noted that some features of the semiconductor structure 100 have been omitted from some of the FIGS. 1A-1D in order to avoid clutter and to allow the reader to focus on the salient aspects of the disclosed embodiments. For example, the above-described semiconductor layers 129 (e.g., silicon layers), insulator layers 129, and components of FETs 121, 122 in semiconductor-on-insulator regions 120 are shown in FIGS. 1B-1C. Similarly, the some of the above-described STI regions 105 that provide isolation between the semiconductor-on-insulator regions and/or the bulk regions are also shown in FIGS. 1B-1C. However, to avoid clutter in the drawings and to allow the reader to focus on the salient aspects of the disclosed embodiments, these features have been omitted from FIGS. 1A and 1D.

As mentioned above, within the semiconductor-on-insulator regions 120, the semiconductor structure 100 can include first FETs 121 above the first well regions 104 and second FETs 122 above the second well regions 104. Those skilled in the art will recognize that one advantage of FDSOI technology processing platforms is that NFETs and PFETs can be formed on insulator layers above Nwells and Pwells, respectively, or vice versa to create FETs with specific types of threshold voltages (VTs) and to allow for fine tuning of the VT through back-biasing. For example, typically, for circuits with super low threshold voltage (SLVT) or low threshold voltage (LVT) FETs, NFETs are formed above Nwells and PFETs are formed above Pwells; whereas, typically, for circuits with regular threshold voltage (RVT) or high threshold voltage (HVT) FETs, NFETs are formed above Pwells and PFETs are formed above Nwells. Current state of the art FDSOI structures will typically include, in any given circuit block, LVTs (or SLVTs), where the NFETs are formed above Nwells and the PFETs are formed above Pwells, or RVTs (or HVTs), where the NFETs are formed above Pwells and the PFETs are formed above Nwells, but not a combination of both. In any case, these different specific VT type FETs will have design specifications (e.g., dopant concentrations, gate dielectric thicknesses, etc.) that vary with the goal of achieving some target VT and, thereby some target switching speed. Additionally, some level of back-biasing (e.g., reverse back-biasing (RBB) or forward back-biasing (FBB)) can be employed to fine tune the VT and, thereby achieve a target switching speed. Forward back-biasing (FBB) refers specifically to applying a voltage that will reduce the VT of the FET, thereby increasing the switching speed. Generally, for PFET, FBB is achieved by applying a negative voltage to the back-side of the channel region; whereas, for an NFET, FBB is achieved by applying a positive voltage to the back-side of the channel region. Reverse back-biasing (RBB) refers specifically to applying a voltage that will increase the VT of the FET, thereby decreasing the switching speed and reducing leakage current. Generally, for a PFET, RBB is achieved by applying a positive voltage to the back-side of the channel region; whereas, for an NFET, RBB is achieved by applying a negative voltage to the back-side of the channel region.

Therefore, in the semiconductor structure 100, the conductivity type of the first FETs 121 above the first well regions 104 (including above the discrete sections 104-1 and 104-2 of a sectioned first well region 104S) and the conductivity type of second FETs 122 above the second well regions 103 can depend upon whether the circuit is designed to include LVT/SLVT FETs or RVT/HVT FETs. For example, in embodiments where the first well regions 104 are Pwells and the second well regions 103 are Nwells, the first FETs 121 on the Pwells could be LVT/SLVT PFETs and the second FETs 122 on the Nwells could be LVT/SLVT NFETs. Alternatively, in embodiments where the first well regions 104 are Pwells and the second well regions 103 are Nwells, the first FETs 121 on the Pwells could be RVT/HVT NFETs and the second FETs 122 on the Nwells could be RVT/HVT PFETs.

Furthermore, in the semiconductor structure 100, different groups of first FETs (e.g., one group of first FETs 121-1 and an additional group of first FETs 121-2) can be above the different sections 104-1 and 104-2 of the sectioned first well region 104S, respectively. The FETs in the group of first FETs 121-1 and the FETs in the additional group of first FETs 121-2 can have the same or different type conductivities. That is, both groups can include PFETs only, both groups can include NFETs only, or one group can include PFETs and the other group can include NFETs. In any case, application specific differences in the group of first FETs 121-1 and the additional group of first FETs 121-2 can make applying different back-biasing conditions (i.e., applying different voltage levels to the back well regions below) beneficial.

In order to apply different voltage bias conditions to the different sections 104-1 and 104-2 of the sectioned first well region 104S, first contact(s) 111-1 can land on the first contact areas 115 of those bulk regions 110 that overlay the section 104-1 and additional first contact(s) 111-2 can land on the first contact areas 115 of those bulk regions 110 that overlay the section 104-2. The first contact(s) 111-1 can be electrically connected by back end of the line (BEOL) wiring to a first voltage source 131-1 and the additional first contact(s) 111-2 can be electrically connected by BEOL wiring to an additional first voltage source 131-2, which is different from the first voltage source 131-1. The different first voltage sources 131-1 and 131-2 can be configured to apply different bias voltages (i.e., bias voltages at different voltage levels) to the different sections 104-1 and 104-2 through the contacts 111-1 and 111-2, respectively.

Each non-sectioned first well region 104 can be contacted and electrically connected to a particular one of the two first voltage sources 131-1 or 131-2 or, alternatively, to some other first voltage source (not shown).

Second contacts 112 can land on the second contact areas 116 of the bulk regions 110 that overlay the second well regions 103. All second contacts 112 can be electrically connected by BEOL wiring to the same second voltage source 132. The second voltage source 132 can be configured to apply the same bias voltage (i.e., a bias voltage at a particular voltage level) to all second well regions 103.

In one exemplary embodiment, the first well regions 104 can be Pwells, which are on a deep Nwell 102 and which are positioned laterally between Nwells 103. The different groups of first FETs 121-1 and 121-2 above the different sections 104-1 and 104-2 of the sectioned Pwell 104S can be different groups of P-type field effect transistors (PFETs) where FBB is employed to tailor and, particularly, reduce the VT and increase the switching speeds of the PFETs in the two groups. One group of PFETs on one section 104-1 of the sectioned Pwell 104S can be stacked to form a header device and, particularly, a switch that selectively connects a circuit to or disconnects a circuit from a positive voltage power supply (e.g., VDD). The PFETs in this group can be relatively small as compared to PFETs elsewhere in the circuit and, particularly, as compared to the PFETs in the other group. By using relatively small PFETs for the header device, off current leakage and area consumption are minimized. However, the smaller PFETs also result in an unwanted increase in on resistance. In prior art structures, the same negative back-biasing voltage would be employed to reduce the VT of the PFETs in the header device and PFETs elsewhere in the circuit and the high on resistance of smaller PFETs in the header device could negatively impact performance. In the disclosed embodiment, a smaller negative voltage could be applied to the section 104-1 of the sectioned Pwell to effectively bring the on resistance of the stack of PFETs back down to a level that is, for example, closer to what the on resistance would have been if smaller PFETs had not been used for the header device.

For purposes of illustration, the semiconductor structure 100 is described above and illustrated in the layout diagram of FIG. 1A as having a single isolation region 199 (e.g., a single Nwell-type isolation region) that divides (i.e., sections) a single first well region 104 (e.g., a single Pwell) into two different sections 104-1 and 104-2. It should be understood, however, that the figures are not intended to be limiting.

Figure 2:
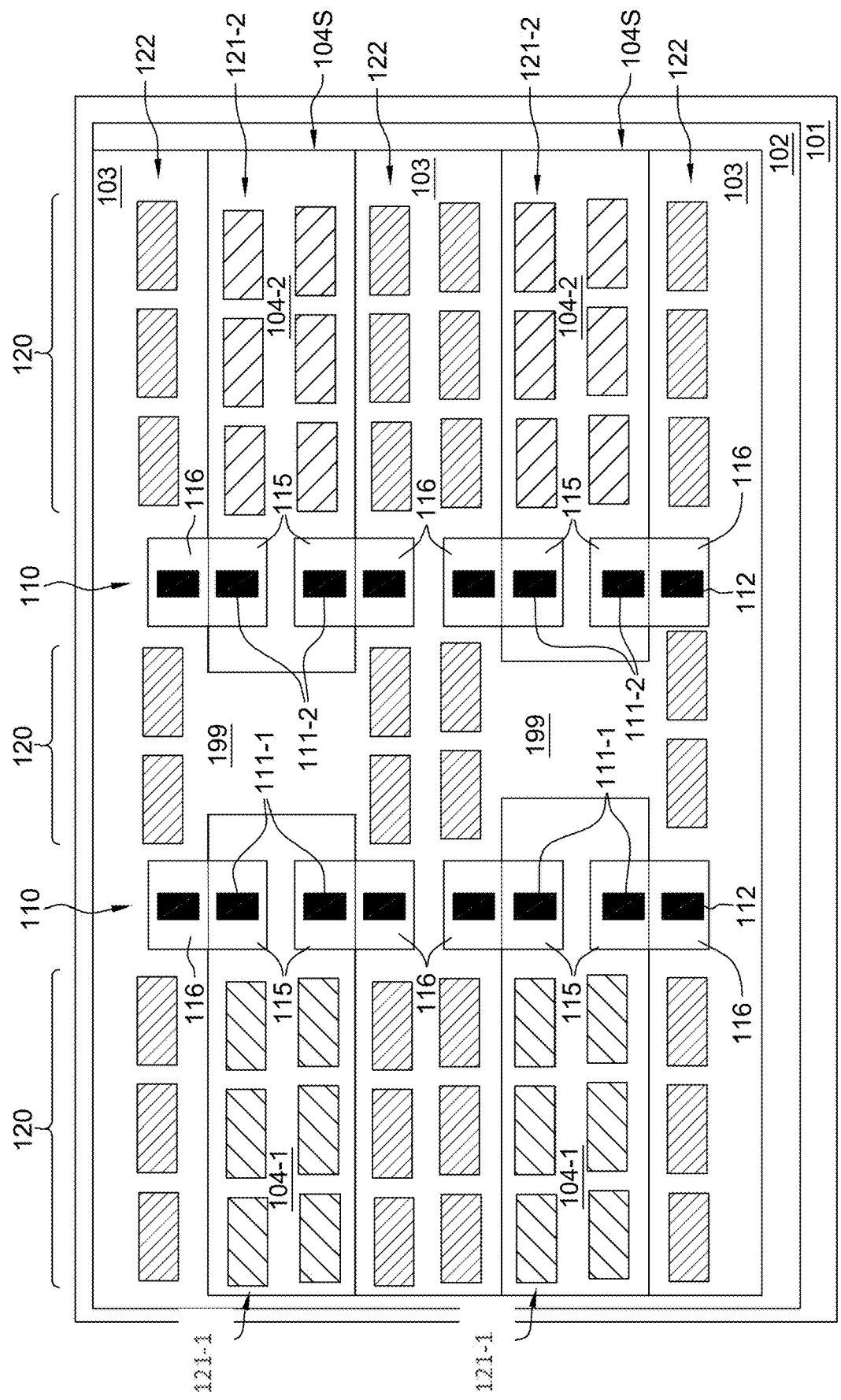
FIG. 2 is layout diagram illustrating an alternative embodiment of the semiconductor structure.

For example, as illustrated in FIG. 2, the semiconductor structure could, alternatively, include multiple first well regions 104 (e.g., multiple Pwells) that are divided (i.e., sectioned) into different sections 104-1 and 104-2 by corresponding isolation regions 199 (e.g., corresponding Nwell-type isolation regions) (as illustrated in FIG. 2). In this case, all sections 104-1 could be electrically connected by first contacts 111-1 and BEOL wiring to a first voltage source (e.g., 131-1) for back-biasing groups of first FETs 121-1 thereon and all sections 104-2 could be electrically connected by additional first contacts 111-2 and BEOL wiring to an additional first voltage source (e.g., 131-2) for back-biasing groups of first FETs 121-2 thereon.

Figure 3:
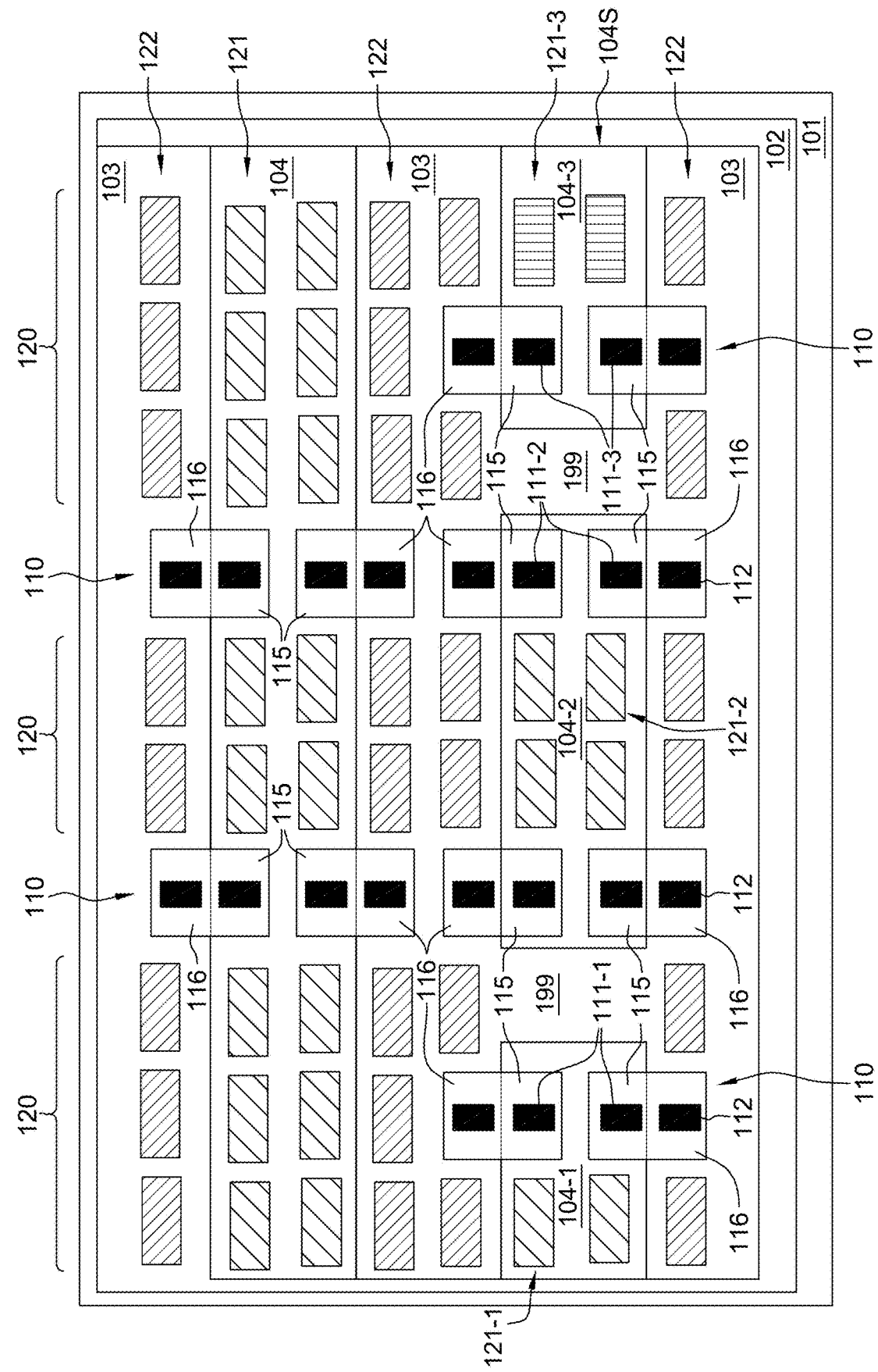
FIG. 3 is a layout diagram illustrating another alternative embodiment of the semiconductor structure.

Also, for example, as illustrated in FIG. 3, the semiconductor structure could, alternatively, include a single first well region 104 (e.g., a single Pwell) divided (i.e., sectioned) into more than two discrete sections by more than one isolation region 199. For example, a single first well region 104 (e.g., a single Pwell) could be divided (i.e., sectioned) into three discrete sections 104-1, 104-2, and 104-3 by two isolation regions 199 (e.g., by two Nwell-type isolation regions). In this case, the section 104-1 could be electrically connected by contact(s) 111-1 and BEOL wiring to one first voltage source (e.g., 131-1) for back-biasing groups of first FETs 121-1 thereon, the section 104-2 could be electrically connected by contact(s) 111-2 and BEOL wiring to another first voltage source (e.g., 131-2) for back-biasing groups of first FETs 121-2 thereon, and the section 104-3 could be electrically connected by contact(s) 111-3 and BEOL wiring to yet another first voltage source (e.g., 131-3) for back-biasing groups of first FETs 121-3 thereon.

Also, for example, the semiconductor structure could, alternatively, include multiple first well regions 104 (e.g., multiple Pwells) divided (i.e., sectioned) into different numbers of discrete sections by isolation region(s).

It should be understood that in the structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
    a semiconductor substrate having a first type conductivity;
    a deep well region within the semiconductor substrate and having a second type conductivity that is different from the first type conductivity;
    first well regions within the semiconductor substrate above the deep well region and having the first type conductivity;
    second well regions within the semiconductor substrate above the deep well region and having the second type conductivity, wherein the first well regions and the second well regions are arranged in alternating elongated parallel stripes across the deep well region with each first well region positioned laterally between and abutting two second well regions;
    an isolation region within the semiconductor substrate above the deep well region and dividing a first well region of the first well regions into different sections; and
    on each section of the different sections, an additional isolation region positioned laterally between a semiconductor-on-insulator region and a contact area, wherein the contact area is positioned laterally between and immediately adjacent to the additional isolation region and the isolation region.

2. The semiconductor structure of claim 1, wherein the different sections are electrically connected to different first voltage sources and wherein the second well regions are all electrically connected to a single second voltage source.

3. The semiconductor structure of claim 2, further comprising:
    semiconductor-on-insulator regions, wherein, within the semiconductor-on-insulator regions, the semiconductor structure includes insulator layers on the first well regions and the second well regions and semiconductor layers on the insulator layers; and
    devices in the semiconductor-on-insulator regions, wherein, due to the isolation region, the different sections are biasable at different voltage levels.

4. The semiconductor structure of claim 3, further comprising bulk regions,
    wherein the bulk regions comprise at least two different bulk regions traversing interfaces between the different sections and an adjacent second well region,
    wherein the different sections are electrically connected to the two different first voltage sources through the two different bulk regions, and
    wherein the adjacent second well region is connected to the single second voltage source through the two different bulk regions.

5. The semiconductor structure of claim 1, wherein, due to the isolation region, the different sections are biasable at different voltage levels.

6. The semiconductor structure of claim 1,
    wherein the isolation region includes a well-type isolation region with the second type conductivity, wherein the isolation region extends vertically from the deep well region to a top surface of the semiconductor substrate, and wherein the isolation region is perpendicular to and extends laterally through the first well region from one side to an opposite side.

7. The semiconductor structure of claim 1, further comprising multiple isolation regions within the semiconductor substrate, wherein the multiple isolation regions divide one of the first well regions into more than two different sections.

8. The semiconductor structure of claim 1, further comprising multiple isolation regions within the semiconductor substrate, wherein the multiple isolation regions divide each of at least two of the first well regions into at least two different sections.

9. A semiconductor structure comprising:
a semiconductor substrate having a first type conductivity;
a deep well region within the semiconductor substrate and having a second type conductivity;
first well regions within the semiconductor substrate above the deep well region and having the first type conductivity;
second well regions within the semiconductor substrate above the deep well region and having the second type conductivity, wherein the first well regions and the second well regions are arranged in alternating elongated parallel stripes in a first direction across the deep well region with each first well region positioned laterally between and abutting two second well regions;
semiconductor-on-insulator regions and bulk regions above and traversing the first well regions and the second well regions in a second direction perpendicular to the first direction; and
a well-type isolation region within the semiconductor substrate above the deep well region, wherein the well-type isolation region has the second type conductivity and divides a first well region of the first well regions into different sections, and wherein the well-type isolation region extends laterally in the first direction between two different bulk regions and extends laterally in the second direction between two different portions of a semiconductor-on-insulator region.

10. The semiconductor structure of claim 9, wherein the different sections are electrically connected to different first voltage sources, respectively, and wherein the second well regions are all electrically connected to a single second voltage source.

11. The semiconductor structure of claim 10, wherein the different sections are electrically connected to the two different first voltage sources through the two different bulk regions.

12. The semiconductor structure of claim 9, wherein, due to the well-type isolation region, the different sections are biasable at different voltage levels.

13. The semiconductor structure of claim 9, further comprising a trench isolation region extending vertically from a top surface of the semiconductor substrate to the well-type isolation region, extending laterally in the first direction between the two different bulk regions, and extending laterally in the second direction between the two different portions of the semiconductor-on-insulator region.

14. The semiconductor structure of claim 9, further comprising multiple well-type isolation regions within the semiconductor substrate, wherein the multiple well-type isolation regions have the second type conductivity and divide the first well region into more than two different sections.

15. The semiconductor structure of claim 9, further comprising multiple well-type isolation regions within the semiconductor substrate, wherein the multiple well-type isolation regions have the second type conductivity and divide each of at least two of the first well regions into at least two different sections.

16. The semiconductor structure of claim 9,
wherein, within the semiconductor-on-insulator regions, the semiconductor structure comprises insulator layers on the first well regions and the second well regions and semiconductor layers on the insulator layers,
wherein the semiconductor structure further comprises devices in the semiconductor-on-insulator regions, and
wherein, due to the well-type isolation region, the different sections are biasable at different voltage levels.

17. A semiconductor structure comprising:
a semiconductor substrate with a first type conductivity;
a deep well region within the semiconductor substrate and having a second type conductivity;
first well regions within the semiconductor substrate above the deep well region and having the first type conductivity;
second well regions within the semiconductor substrate above the deep well region and having the second type conductivity, wherein the first well regions and the second well regions are arranged in alternating elongated parallel stripes in a first direction across the deep well region with each first well region positioned laterally between and abutting two second well regions;
semiconductor-on-insulator regions and bulk regions above and traversing the first well regions and the second well regions in a second direction perpendicular to the first direction;
a well-type isolation region within the semiconductor substrate above the deep well region and dividing a first well region of the first well regions into different sections, wherein the well-type isolation region has the second type conductivity, extends laterally in the first direction between two different bulk regions and extends laterally in the second direction between different portions of a semiconductor-on-insulator region; and
field effect transistors in the semiconductor-on-insulator regions, wherein, due to the isolation region, the different sections are biasable at different voltage levels.

18. The semiconductor structure of claim 17, wherein the different sections are connected to receive different voltages, respectively.

19. The semiconductor structure of claim 17, further comprising a trench isolation region extending vertically from a top surface of the semiconductor substrate to the well-type isolation region, extending laterally in the first direction between the two different bulk regions, and extending laterally in the second direction between the different portions.

20. The semiconductor structure of claim 17, wherein the first well regions and the second well regions have approximately equal lengths and approximately aligned ends.

* * * * *